(12) United States Patent
Su et al.

(45) Date of Patent: May 4, 2010
(10) Patent No.: US 7,709,908 B2

(54) HIGH-VOLTAGE MOS TRANSISTOR DEVICE

(75) Inventors: Chao-Yuan Su, Hsinchu (TW);
Wei-Lun Hsu, Hsin-Chu Hsien (TW);
Ching-Ming Lee, Miaoli County (TW);
Chih-Jen Huang, Hsinchu (TW);
Te-Yuan Wu, Hsin-Chu (TW);
Chun-Hsiung Peng, Tao-Yuan (TW)

(73) Assignee: United Microelectronics Corp., Hsin-Chu (TW)

( * ) Notice: Subject to any disclaimer, the term of this patent is extended or adjusted under 35 U.S.C. 154(b) by 312 days.

(21) Appl. No.: 11/836,785

(22) Filed: Aug. 10, 2007

(65) Prior Publication Data

US 2009/0039424 A1 Feb. 12, 2009

(51) Int. Cl.
*H01L 29/78* (2006.01)
(52) U.S. Cl. .................. 257/409; 257/E21.409
(58) Field of Classification Search ................ 257/335, 257/339, 409, 491, E21.409
See application file for complete search history.

(56) References Cited

U.S. PATENT DOCUMENTS

| 5,382,826 | A | 1/1995 | Mojaradi et al. |
| 5,496,761 | A * | 3/1996 | Ravanelli et al. ............ 438/241 |
| 5,541,439 | A | 7/1996 | Mojaradi et al. |
| 5,646,431 | A * | 7/1997 | Hsu et al. .................... 257/342 |
| 6,873,011 | B1 * | 3/2005 | Huang et al. ................. 257/345 |
| 2001/0004124 | A1 | 6/2001 | Noda et al. |
| 2001/0030346 | A1 * | 10/2001 | Jeon et al. .................... 257/339 |
| 2007/0057293 | A1 | 3/2007 | Kao |
| 2009/0039425 | A1 * | 2/2009 | Shu et al. .................... 257/339 |

FOREIGN PATENT DOCUMENTS

CN    1301045 A    6/2001

* cited by examiner

*Primary Examiner*—Nathan W Ha
(74) *Attorney, Agent, or Firm*—Wintson Hsu

(57) ABSTRACT

A high-voltage transistor device has a substrate, an isolation structure, a source, a gate, a drain, a plurality of doped regions, a plurality of ion wells, and a first dielectric layer disposed on the substrate. The high-voltage transistor device further has a first conductive layer and a plurality of first field plate rings. The first conductive layer is electrically connected to the drain and at least one of the first field plate rings.

26 Claims, 7 Drawing Sheets

HIGH-VOLTAGE MOS TRANSISTOR DEVICE

BACKGROUND OF THE INVENTION

1. Field of the Invention

The invention relates to a high-voltage MOS transistor device, and particularly, to a high-voltage MOS transistor device having a plurality of first field plate rings. A voltage is applied upon the first field plate rings to maintain a constant electric field within the high-voltage MOS transistor device and prevent breakdown of the high-voltage MOS transistor device.

2. Description of the Prior Art

Current power systems provide an alternating current having a variety of frequencies ranging from 50 to 60 Hz, and a voltage ranging from 100 to 240 volts (V). Every electrical device has a particular working voltage and frequency condition, and therefore, electrical devices and related passive elements utilized in the electrical devices, such as inductors, capacitors, resistors and transformers, act as a switch to determine the value of the voltage and the type of the current thereof. For example, a conventional air conditioner utilizes a power supply providing a low-voltage current for the inner facilities. The power supply switch reduces the voltage provided by the outer power system to an appropriate voltage for the inner facilities. In addition, the power supply switch has the characteristics of high efficiency, low weight, small size and reduced power consumption.

High-voltage metal-oxide semiconductors may function as switches and are broadly utilized in CPU power supplies, power management systems, AC/DC converters, LCD/plasma TV drivers, automobile electronic components, PC peripheral devices, small DC motor controllers, and other consumer electronic devices. The power source supplied by the outer voltage source is an AC power. The usual waveform of an AC power circuit is a sine wave, and a 240V AC power may alter its voltage from −300V to +300V. The voltage may over 600V in an instant. This is greater than the breakdown voltage of most HV MOS transistor devices in the field and leads to HV MOS transistor device damage. Therefore, an HV MOS transistor device capable of withstanding high-voltages is required.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a high-voltage MOS transistor device having a plurality of field plate rings, and particularly to a high-voltage MOS transistor device capable of preventing breakdown by applying a bias to one of the field plate ring thereof.

Therefore, a high-voltage MOS transistor device is provided. The high-voltage MOS transistor device has a substrate of a first conductive type, a source of a second conductive type, a drain of the second conductive type, at least a second doped region, and a third ion well disposed around the second doped region. Furthermore, the high-voltage MOS transistor device has an isolation structure positioned on a part of the third ion well, and a gate dielectric layer disposed on a surface of the substrate between the source and the isolation structure. The high-voltage MOS transistor also has a first dielectric layer covering the gate, the doped regions, and the isolation structure. In addition, a plurality of first field plate and a first conductive layer disposed across the first field plate rings are positioned on the first dielectric layer. The first conductive layer has a first end electrically connected to the drain, a second end electrically connected to at least one of the first field plate rings, and a third end electrically connected to a pad.

The present invention utilizes the electrical connection between the first conductive layer, the drain, and the first field plate rings to induce a corresponding electrode field to decrease the electrical field nearby the interface between the first doped region and the third ion well, which is positioned next to the drain. The minimum breakdown voltage of the high MOS transistor device of the present invention is about 700V. Therefore, the high-voltage MOS transistor device of the present invention has a better voltage capability than prior art HV MOS transistor devices.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
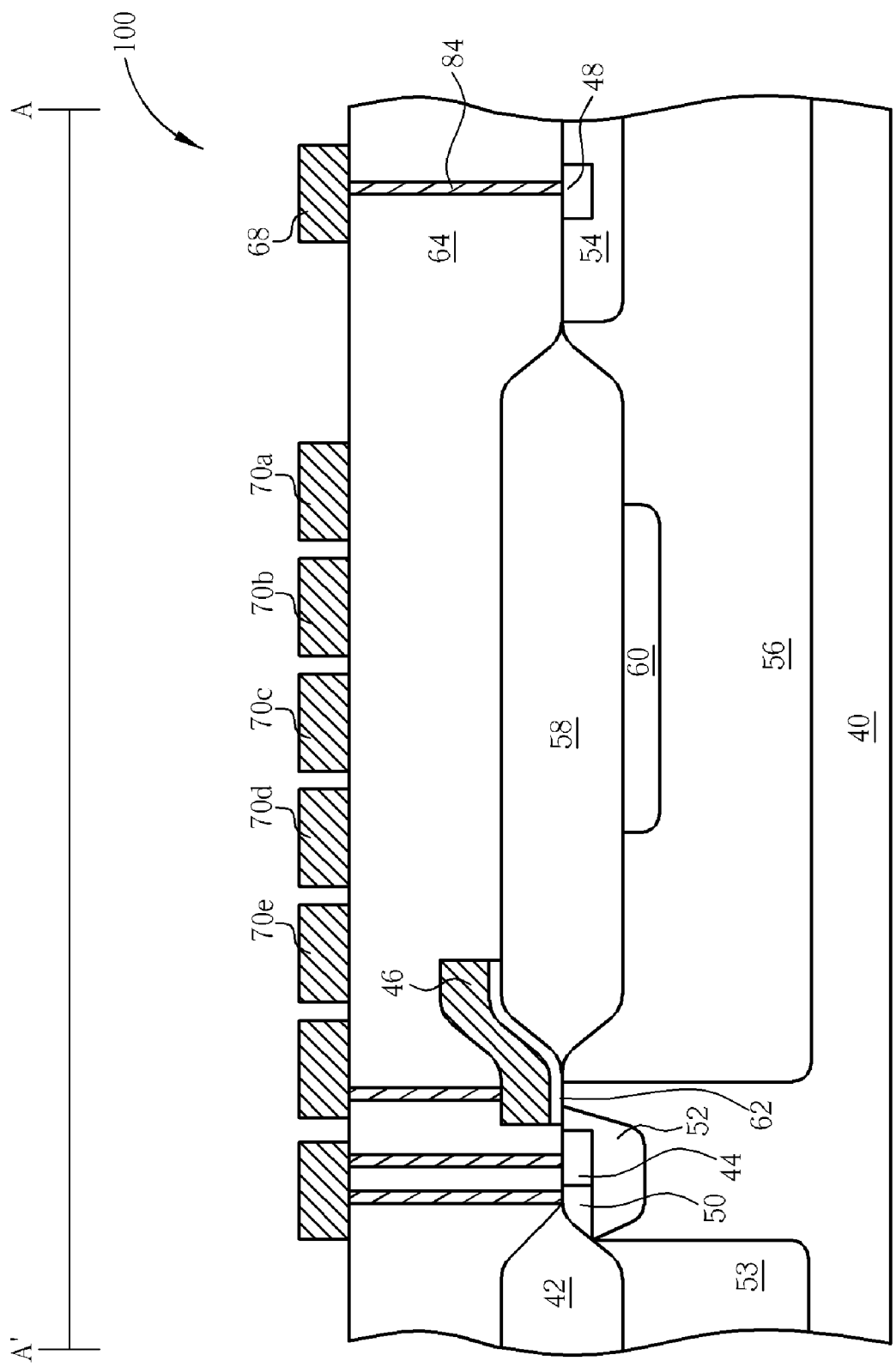
FIG. 1 and FIG. 2 are schematic diagrams of a high-voltage MOS transistor device according to a first embodiment of the present invention.

Hereinafter, preferred embodiments of the present invention will be described with reference to the accompanying drawings, in which components with substantially the same functions are identified by the same reference numeral for the sake of simplicity. The following description of the present invention will focus on a high-voltage MOS transistor device with a high breakdown voltage of at least 700V. It should be noted, however, that the present invention is in no way limited to the following illustrative embodiments.

Figure 2:
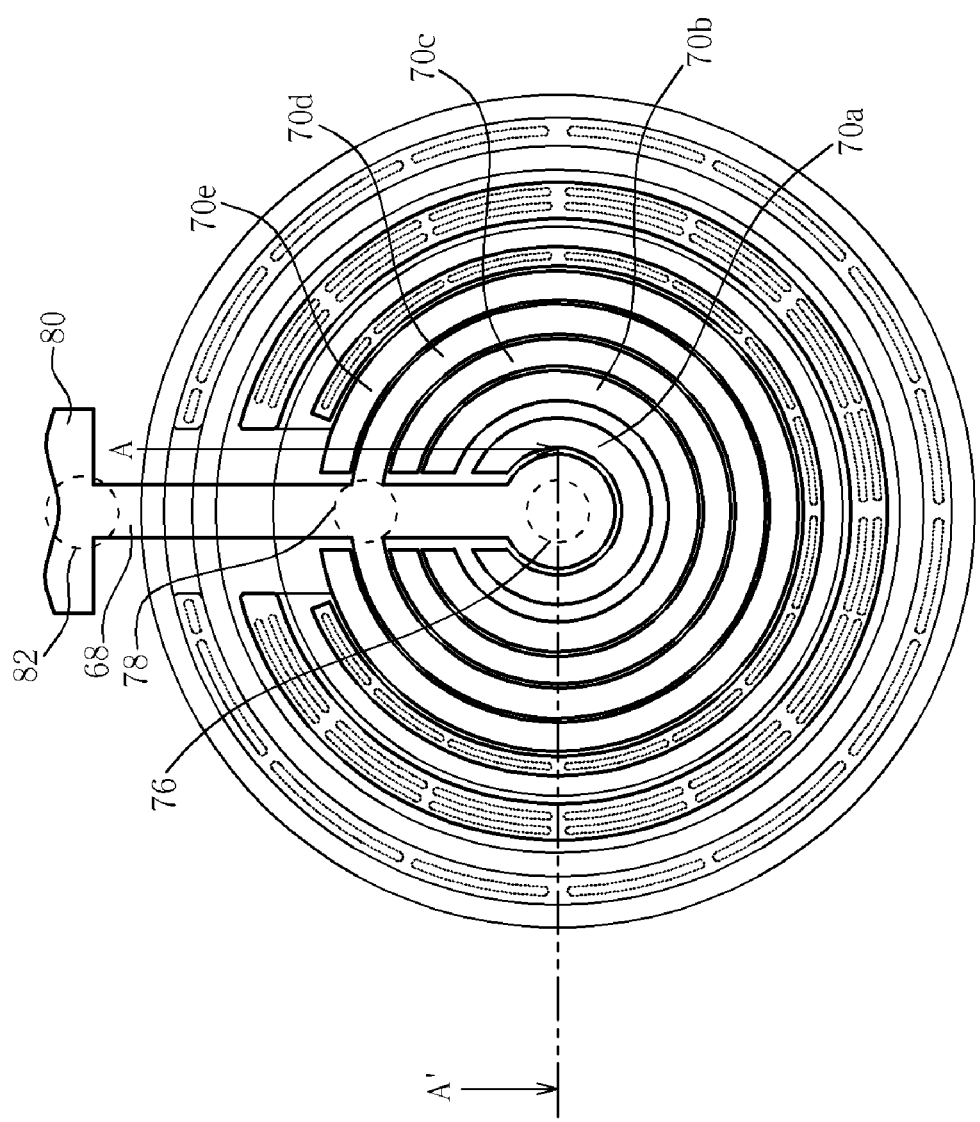

A high-voltage MOS transistor device according to a first embodiment of the present invention will be described with reference to FIG. 1 and FIG. 2. FIG. 1 shows a cross-section diagram of the high-voltage MOS transistor device of the present invention. FIG. 2 shows a top view of the high-voltage MOS transistor device of the present invention, where the region between A and A' in FIG. 1 corresponds to the region between A and A' in FIG. 2. The high-voltage MOS transistor device 100 is formed on a substrate 40, such as a P doped silicon substrate, and the active area of the high-voltage MOS transistor device 100 is isolated by at least an isolation structure, such as a field oxide layer 42, or at least a shallow trench isolation (not shown). The high-voltage MOS transistor device 100 has a source 44, a gate 46, and a drain 48. The source 44 is a heavily N doped region and positioned next to a first heavily P doped region 50. Both the source 44 and the first heavily P doped region 50 are formed in a first P ion well 52. Next to the first P ion well 52 is a high-voltage P doped well 53. The drain 48 is a heavily N doped region and is formed within a second N ion well 54, which is formed within a third deep N well 56, forming a triple-well structure. As shown in FIG. 1, another isolation structure is disposed on a part of the third deep N well 56 and next to the second N well 54. The isolation structure may be a field oxide 58 or at least an STI (not shown). Moreover, at least a second P doped region 60 is formed under the field oxide 58, and positioned between the first P ion well 52 and the second N ion well 54. For the sake of simplicity, only one second P doped region 60 is shown in FIG. 1. The high-voltage MOS transistor device 100 of the present invention may have more than one second P doped region 60. The number of the second P doped region 60 is adaptable depending on the requirement. The high-voltage MOS transistor device 100 further has a gate dielectric layer 62 formed on a surface of the substrate 40 between the source 44 and the field oxide 58. Therefore, the gate 46 of the high-voltage MOS transistor device 1 00 is disposed on the gate dielectric layer 62 and extended to approach the field oxide 58. The high-voltage MOS transistor device 100 also has a first dielectric layer 64 covering the gate 46, the doped regions, the ion wells and the field oxide 58.

As shown in FIG. 1, PN junctions are formed between the second P doped region 60 and the third deep N well 60. When the high-voltage MOS transistor device 100 is working, the distribution of the electrical field at the PN junctions nearing the source 44 and the drain 48 are intensive, especially the PN junction positioned next to the drain 48. This results in breakdown of the high-voltage MOS transistor device 100. In order to prevent the high-voltage MOS transistor device 100 from breakdown, the high-voltage MOS transistor device 100 of the present invention further has a plurality of first field plate rings and a first conductive layer 68 disposed on the first dielectric layer 64. Please refer to FIG. 1 and FIG. 2 together. FIG. 2 shows a vertical view of the high-voltage MOS transistor device 100. For the sake of simplicity, five field plate rings 70a, 70b, 70c, 70d, and 70e are shown in the present embodiment. The field plate rings 70a-e all have the same critical dimension and are positioned as concentric circles. The critical dimension of the field plate rings 70a-e, the interval between each field plate rings 70a-e, and the quantities of the field plate rings 70a-e may be modified as required. As shown in FIG. 2, the first conductive layer 68 has at least three ends electrically connected to other components of the high-voltage MOS transistor device 100 or peripheral electronic facilities thereof. The first field plate 68 has a first end 76 electrically connected to the drain 48, a second end 78 electrically connected to the first field plate ring 70d, and a third end 82 electrically connected to a pad 80. The second end 78 connected to the first field plate 70d is positioned above the PN junction between the third N ion well 56 and the second P doped region 60 next to the source 44. Except for the first field plate ring 70d connected to the first conductive layer 60, the field plate rings 70a, 70b, 70c, and 70e are floating rings.

As can be seen from FIG. 1 and FIG. 2, the first conductive layer 68 applies a voltage from the drain 48 through a first via plug 84, the first end 76, and the second end 78 to the first field plate ring 70d. The voltage may induce an electrical field to decrease the electrical field at the PN junction next to the source 44 and the PN junction next to the drain 48 through a coupling effect. As a result, a breakdown effect is prevented.

Figure 3:
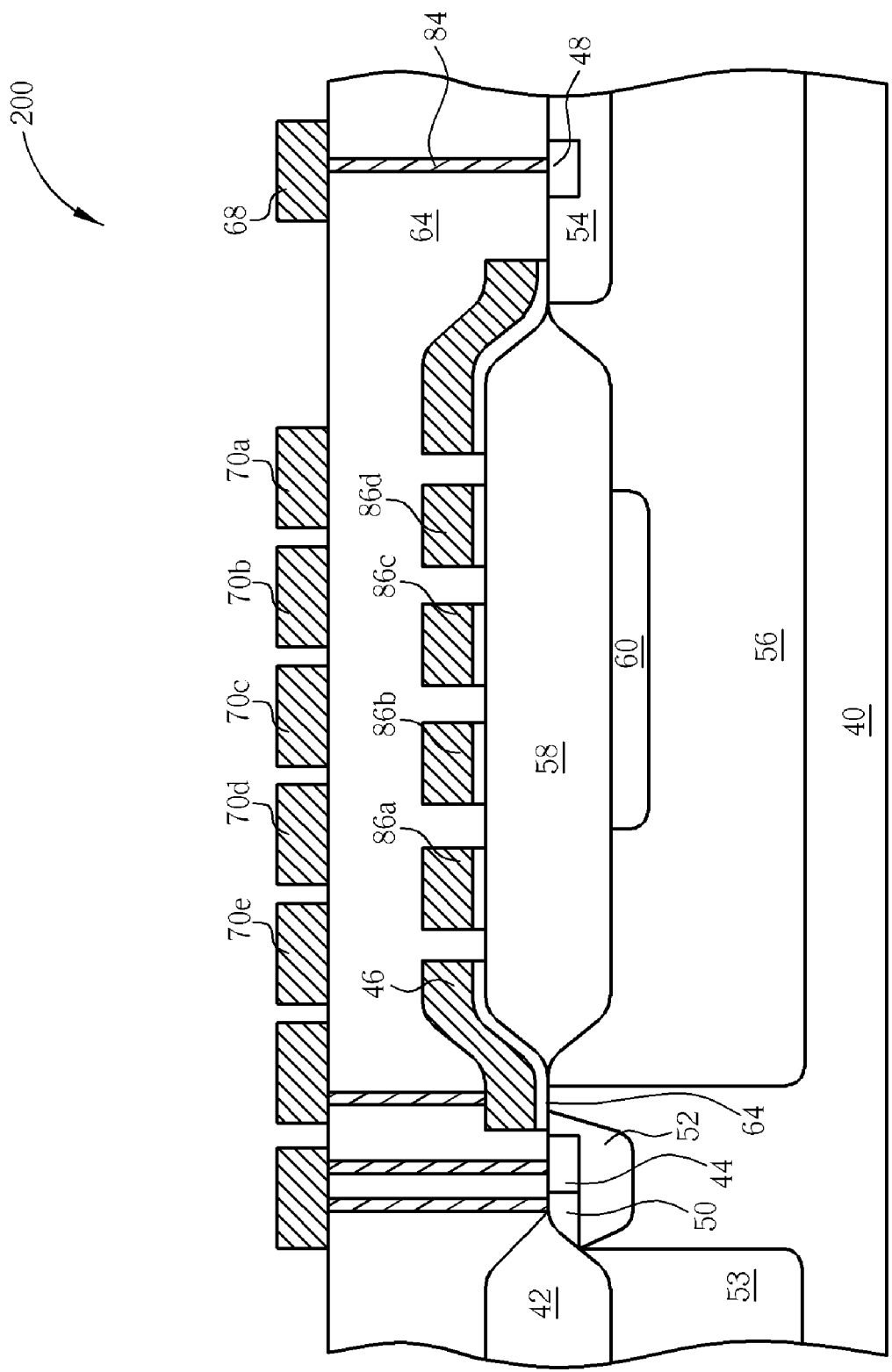
FIG. 3 shows another high-voltage MOS transistor device according to a second embodiment of the present invention.

A second embodiment of the present disclosure is illustrated in conjunction with FIG. 3. FIG. 3 shows another high-voltage transistor device 200 according to a second embodiment of the present invention. Components with substantially the same functions as those of the high-voltage MOS transistor 100 are identified by the same reference numeral for the sake of simplicity. These components are numbered as those of the high-voltage transistor device 100. As shown in FIG. 3, the high-voltage transistor device 200 has a plurality of second field plate rings 86a, 86b, 86c, and 86d disposed between the first field plate rings 70a-e and the field oxide 58. The preferred material of the second field plate rings 86a-d comprises polysilicon or other materials having similar electrical properties as polysilicon. The second field plate rings 86a-d are respectively positioned between each of the field plate rings 70a-e. In addition to the mechanism illustrated in the first embodiment, the high-voltage MOS transistor device 200 may utilize other mechanisms to decrease the electrical field at the PN junction nearing the drain 48 and the source 44. For instance, another voltage may be applied to one of the second field plate rings 86a-d directly to induce its corresponding electrical field in order to decrease the electrical field near the PN junction next to the source 44 and the PN junction next the drain 48.

Figure 4:
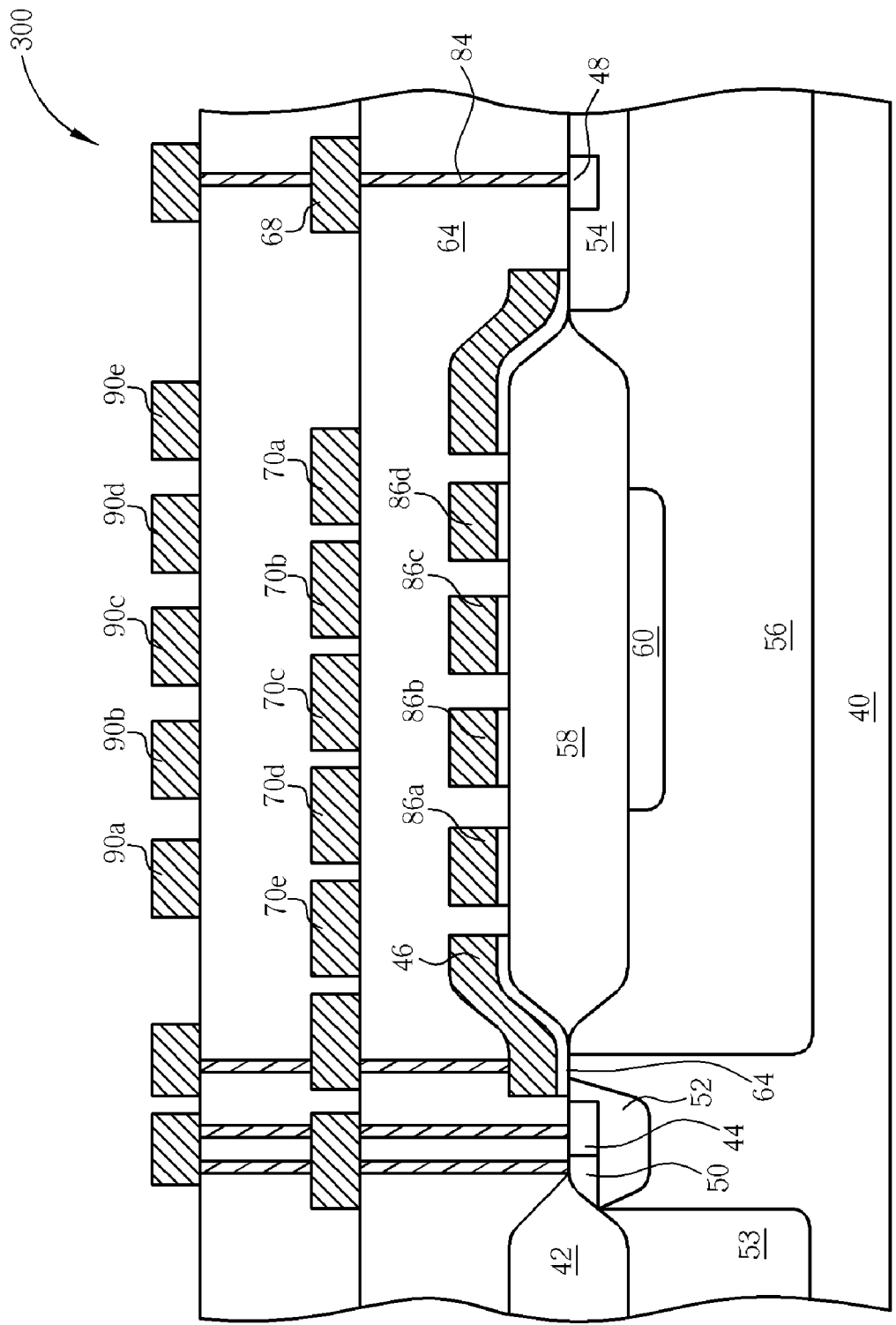
FIG. 4 further shows a high-voltage MOS transistor device according to a third embodiment of the present invention.

FIG. 4 is a schematic diagram of a high-voltage MOS transistor device 300 according to a third embodiment of the present invention. Components with substantially the same functions as those of the first embodiment or the second embodiment are identified by the same reference numeral for the sake of simplicity. In addition to the second plate rings 86a-d, the high-voltage MOS transistor device 300 additionally has a second dielectric layer 88 and a plurality of third field plate rings 90a, 90b, 90c, 90d, and 90e disposed on the second dielectric layer 88. The preferred material of the third field plate rings 90a-e may include metal or other conductive materials. The third field plate rings 90a-e are respectively positioned between each of the first field plate rings 70a-e. When the high-voltage MOS transistor device 300 is working, a voltage may be applied directly to the third field plate rings 90a-e and form a corresponding electrical field coupled to the first field plate rings 70a-e or the second field plate rings 86a-d. This is to ensure that the electrical field that lies near the PN junctions between the third N ion well 56 and the second P doped region 60 approaching to the source 44 and the drain 48 will be decreased.

Figure 5:
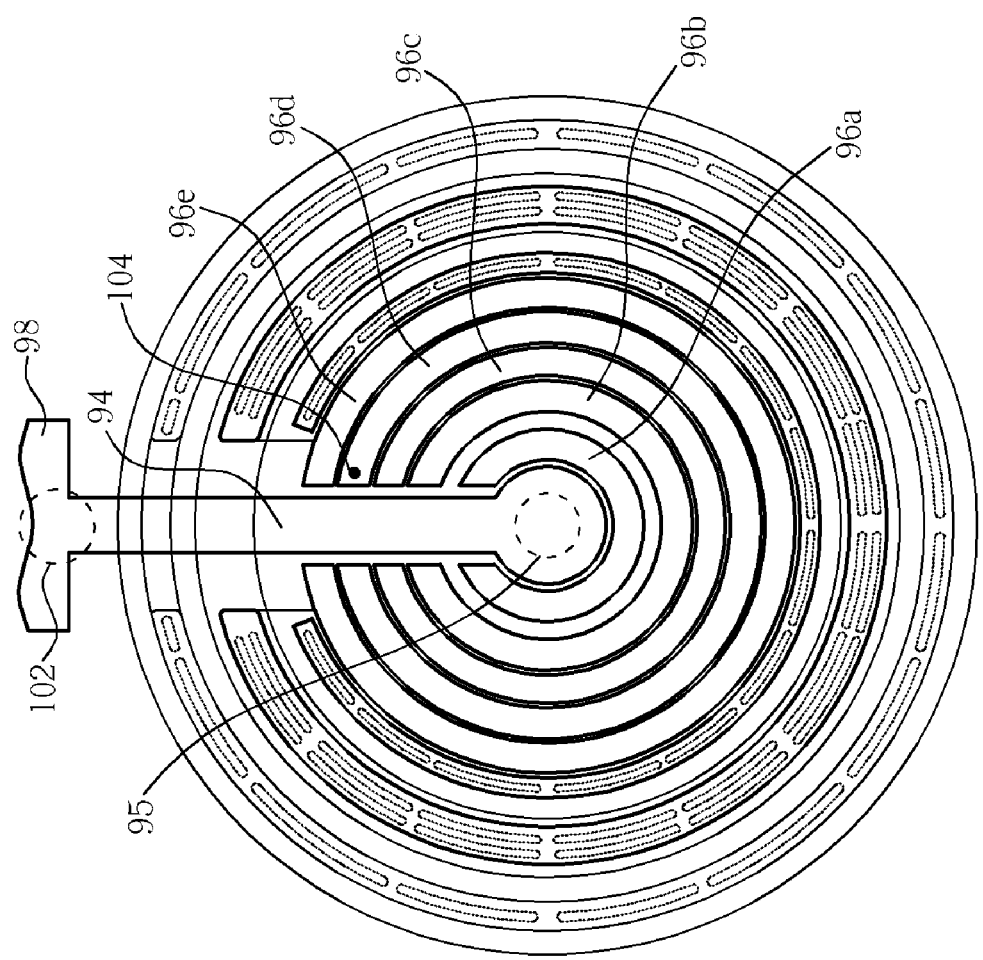
FIG. 5 and FIG. 6 are schematic diagrams of a high-voltage MOS transistor device according to a fourth embodiment of the present invention.
Figure 6:
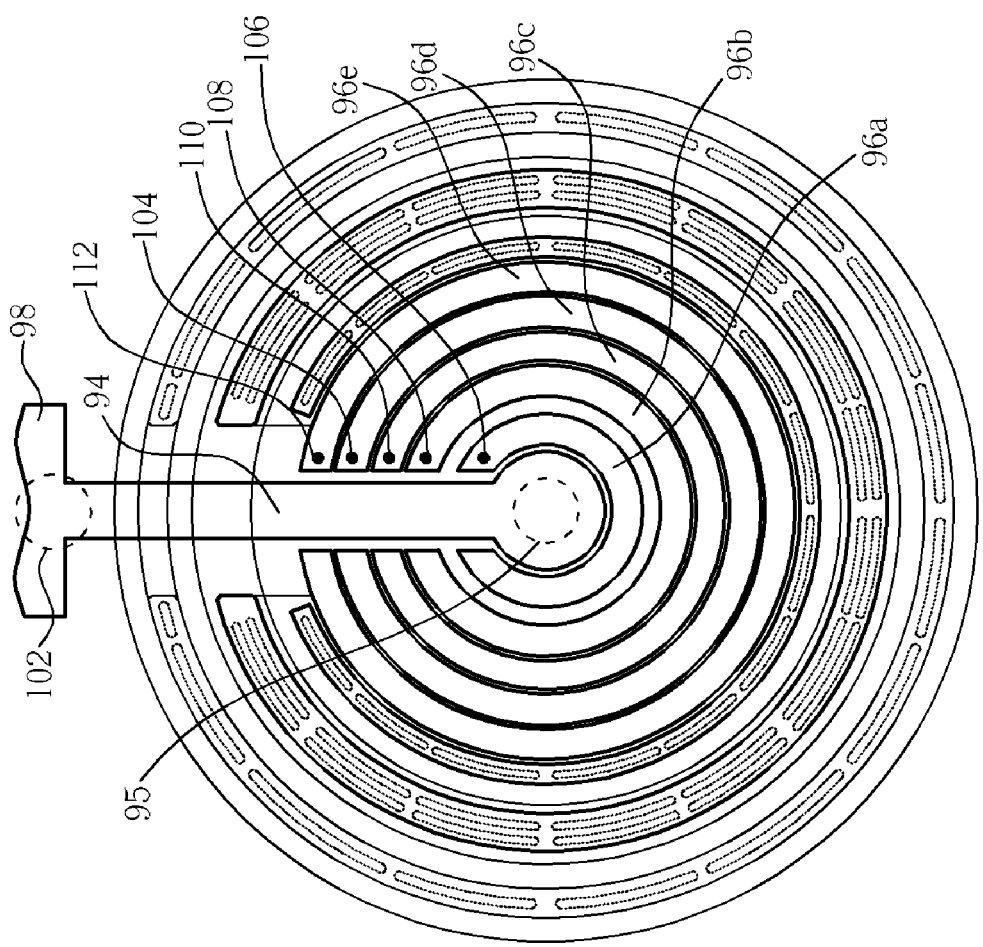

Based on the spirit of the present invention, a fourth embodiment is disclosed with reference to FIG. 5 and FIG. 6, which are schematic diagrams of a plurality of first field plate rings 96a, 96b, 96c, 96d, 96e and a first conductive layer 94 of a high-voltage MOS transistor device. Other components of the high-voltage MOS transistor devices are the same as the prior embodiments. The field plate rings 96a-e are floating field plate rings. At least one of the floating field plate rings, such as the first field plate ring 96d in FIG. 6, is electrically connected to a first power supply 104. Therefore, a voltage from the first power supply 104 is applied to the first field plate ring 96d to decrease the electrical field near the PN junction next to the drain (not shown) and the PN junction next to the source (not shown). The value of the voltage may be equal to or less than that of the drain. Additionally, each of the floating first field plate rings 96a-e may be connected to a respective power supply. As shown in FIG. 6, the first field plate ring 96a is electrically connected to a second power supply 106, and the first field plate ring 96b is electrically connected to a third power supply 108. The first field plate ring 96c is electrically connected to a fourth power supply 110, and the first field plate ring 96d is electrically connected to the first power supply 104. Furthermore, the first field plate ring 96e is electrically connected to a fifth power supply 112.

The value of the voltage provided by the power supplies may be modified as a proper value for the high-voltage MOS transistor.

Figure 7:
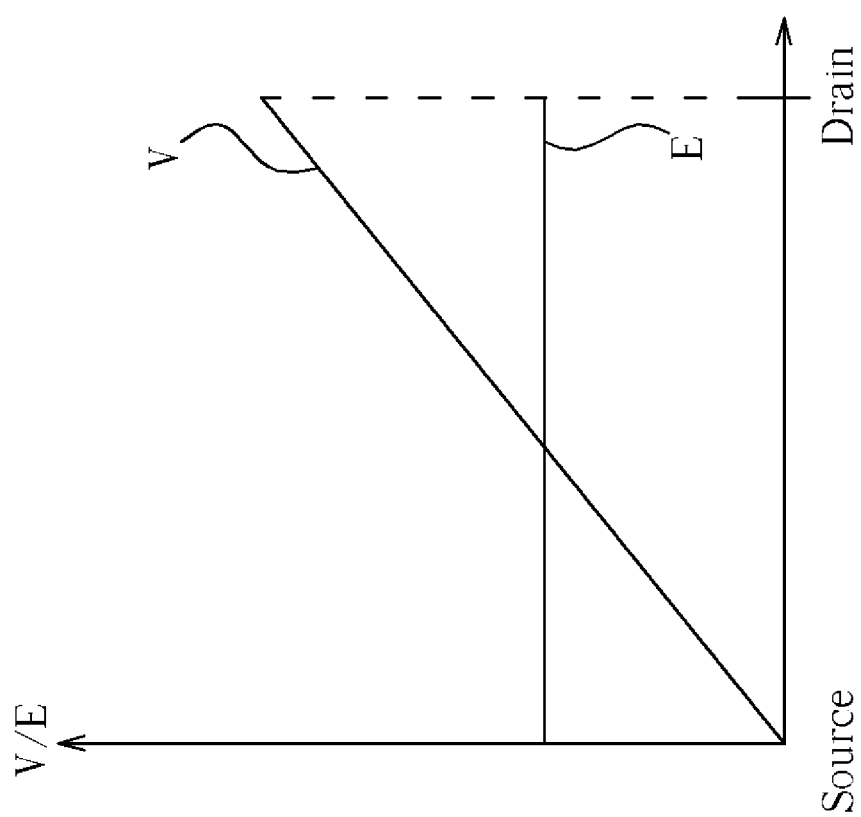
FIG. 7 is an electrical field-voltage plot of the high-voltage MOS transistor device of the present invention.

FIG. 7 shows an electrical field (E)-potential (V) plot of the high-voltage MOS transistor device. According to the prior embodiments, the high-voltage MOS transistors utilize the first conductive layer to apply a voltage to at least one of the first field plate rings and decrease the electrical field at the PN junction next to the drain or the source through coupling. Therefore, the high-voltage MOS transistor device has a constant electrical field. The voltage distribution of the high-voltage MOS transistor device decreases gradually from the drain to the source. Therefore, when the high-voltage MOS transistor is utilized as a component of the power supply system, the high-voltage MOS transistor is capable of reducing the incoming voltage to a working voltage of the internal electrical system.

According to the above-mentioned embodiments, the high-voltage MOS transistor device of the present invention connects the first conductive layer and at least one of the first field plate rings to maintain a constant electrical field inside the high-voltage MOS transistor device. Additionally, the high-voltage MOS transistor device of the present invention may have two or more connecting ends between the first field plate rings and the first conductive layer. These connecting ends may be separate or positioned next to each other. Locating the first field plate rings and the first conductive layer on different planes is also allowable. If the first field plate rings and the first conductive layer are positioned on different planes, a second via plug may be utilized to connect the first conductive layer and the field plate rings electrically. Furthermore, each of the above-mentioned embodiments applies a voltage to the first field plate as an example. The voltage may be applied to the second field plate rings or the third field plate rings and has the same effect as being applied to the first field plate. Moreover, the shape of the field plate rings, although illustrated as concentric circles in the embodiments, may be rectangular rings, or polygonal rings that have the same function.

Those skilled in the art will readily observe that numerous modifications and alterations of the device and method may be made while retaining the teachings of the invention.

What is claimed is:

1. A high-voltage MOS transistor device, comprising:
   a substrate of a first conductive type;
   a source of a second conductive type disposed in the substrate;
   a drain of the second conductive type disposed in a well;
   at least a second doped region of the first conductive type disposed between the source and the drain;
   a third ion well of the second conductive type disposed around the second doped region in the substrate;
   an isolation structure disposed on a part of the third ion well;
   a gate dielectric layer disposed on a surface of the substrate between the source and the isolation structure;
   a gate disposed on a surface of the gate dielectric layer and extended to approach the isolation structure;
   a first dielectric layer covering the gate, the doped regions, and the isolation structure; and
   a plurality of field plate rings disposed on the first dielectric layer; and
   a first conductive layer disposed across the field plate rings, the first conductive layer comprising:
   a first end electrically connected to the drain;
   a second end electrically connected to at least one of the field plate rings; and
   a third end electrically connected to a pad.

2. The high-voltage MOS transistor device of claim 1, wherein the high-voltage MOS transistor device further comprises a first doped region of the first conductive type disposed next to the source in the substrate.

3. The high-voltage MOS transistor device of claim 1, wherein the high-voltage MOS transistor device further comprises a first ion well of the first conductive type disposed around the source and the first doped region in the substrate.

4. The high-voltage MOS transistor device of claim 1, wherein the high-voltage MOS transistor device further comprises a second ion well of the second conductive type disposed around the drain in the substrate.

5. The high-voltage MOS transistor device of claim 1, wherein the second end is positioned above an interface between the third ion well and the second doped region.

6. The high-voltage MOS transistor device of claim 2, wherein the interface between the third ion well and the second doped region is positioned next to the source.

7. The high-voltage MOS transistor device of claim 1, wherein the high-voltage MOS transistor device further comprises a plurality of second field plate rings disposed on the isolation structure, and the second field plate rings are respectively positioned between each of the first field plate rings.

8. The high-voltage MOS transistor device of claim 1, wherein the isolation structure includes a field oxide or at least a shallow trench isolation (STI).

9. The high-voltage MOS transistor device of claim 1, wherein the first conductive type is P-type, and the second conductive type is N-type.

10. The high-voltage MOS transistor device of claim 1, wherein the first end of the first conductive layer is electrically connected to the drain through a first via plug.

11. The high-voltage MOS transistor device of claim 1, wherein the high-voltage MOS transistor device further comprises a second dielectric layer covering the first field plate rings and the first dielectric layer.

12. The high-voltage MOS transistor device of claim 11, wherein the high-voltage transistor device further comprises a plurality of third field plate rings disposed on the second dielectric layer, and the third field plate rings are respectively positioned between each of the first field plate rings.

13. The high-voltage MOS transistor device of claim 1, wherein the first field plate rings are arranged as concentric circles, rectangular rings, or polygonal rings.

14. A high-voltage MOS transistor device, comprising:
   a substrate of a first conductive type;
   a source of a second conductive type disposed in the substrate;
   a drain of the second conductive type disposed in a well;
   at least a second doped region of the first conductive type disposed between the source and the drain in the substrate;
   a third ion well of the second conductive type disposed around the second doped region in the substrate;
   an isolation structure disposed on a part of the third ion well;
   a gate dielectric layer disposed on a surface of the substrate between the source and the isolation structure;
   a gate disposed on a surface of the gate dielectric layer and extended to approach the isolation structure;
   a first dielectric layer covering the gate, the doped regions, the ion wells and the isolation structure; and a plurality of first field plate rings disposed on the first dielectric layer, at least one of the field plate rings being electrically connected to a first power supply; and a first conductive layer disposed across the first field plate rings, the first conductive layer comprising:
a first end electrically connected to the drain; and
a third end electrically connected to a pad.

15. The high-voltage MOS transistor device of claim 14, wherein the high-voltage MOS transistor device further comprises a first doped region of the first conductive type disposed next to the source in the substrate.

16. The high-voltage MOS transistor device of claim 14, wherein the high-voltage MOS transistor device further comprises a first ion well of the first conductive type disposed around the source and the first doped region in the substrate.

17. The high-voltage MOS transistor device of claim 14, wherein the high-voltage MOS transistor device further comprises a second ion well of the second conductive type disposed around the drain in the substrate.

18. The high-voltage MOS transistor device of claim 14, wherein the second end is positioned above an interface between the third ion well and the second doped region.

19. The high-voltage MOS transistor device of claim 18, wherein the interface between the third ion well and the second doped region is positioned next to the source.

20. The high-voltage MOS transistor device of claim 14, wherein the high-voltage MOS transistor device further comprises a plurality of second field plate rings disposed on the isolation structure, and the second field plate rings are respectively positioned between each of the first field plate rings.

21. The high-voltage MOS transistor device of claim 14, wherein the isolation structure includes a field oxide or at least a shallow trench isolation (STI).

22. The high-voltage MOS transistor device of claim 14, wherein the first conductive type is P-type, and the second conductive type is N-type.

23. The high-voltage MOS transistor device of claim 14, wherein the first end of the first conductive layer is electrically connected to the drain through a first via plug.

24. The high-voltage MOS transistor device of claim 14, wherein the high-voltage MOS transistor device further comprises a second dielectric layer covering the first field plate rings and the first dielectric layer.

25. The high-voltage MOS transistor device of claim 24, wherein the high-voltage transistor device further comprises a plurality of third field plate rings disposed on the second dielectric layer, and the third field plate rings are respectively positioned between each of the first field plate rings.

26. The high-voltage MOS transistor device of claim 14, wherein the first field plate rings are arranged as concentric circles, rectangular rings, or polygonal rings.

* * * * *